United States Patent [19]

Morisako

[11] Patent Number: 5,433,371

[45] Date of Patent: Jul. 18, 1995

[54] WIRE BONDING APPARATUS AND METHOD

[75] Inventor: Isamu Morisako, Fukuoka, Japan

[73] Assignee: Matsushita Electric Industrial Co., Ltd., Osaka, Japan

[21] Appl. No.: 135,337

[22] Filed: Oct. 13, 1993

[30] Foreign Application Priority Data

Oct. 15, 1992 [JP] Japan .................. 4-276905

[51] Int. Cl.6 .................. B23K 35/38; B23K 31/02
[52] U.S. Cl. .................. 228/180.5; 228/4.5; 228/42; 228/206
[58] Field of Search .................. 228/206, 180.5, 219, 228/4.5, 42

[56] References Cited

U.S. PATENT DOCUMENTS 4,159,075  6/1979  Ljung et al. .................. 228/206
5,192,582  3/1993  Liedke et al. .................. 228/206

FOREIGN PATENT DOCUMENTS 557756   9/1993  European Pat. Off. .................. 228/206
61-101040  5/1986  Japan .................. 228/4.5
61-194734  8/1986  Japan .................. 228/4.5
3-159143A  7/1991  Japan .

*Primary Examiner*—P. Austin Bradley
*Assistant Examiner*—Jeffrey T. Knapp
*Attorney, Agent, or Firm*—Stevens, Davis, Miller & Mosher

[57] ABSTRACT

A wire bonding apparatus has a sealed casing having an opening which can be opened and closed, a device for gas-tightly dividing the casing into first and second chambers, a sealing device that is movable for communicating the two chambers with each other, a device for supplying an inert gas into the first chamber, a device for supplying oxygen gas or ozone gas into the second chamber, a device for connecting an electrode of the substrate to an electrode of the semiconductor chip via the wire in the first chamber, a device for generating glow discharge in the second chamber, and a device for transporting the substrate between the first and second chambers. Wire bonding is immediately performed after impurities are removed from the electrodes by electrical discharge.

13 Claims, 6 Drawing Sheets

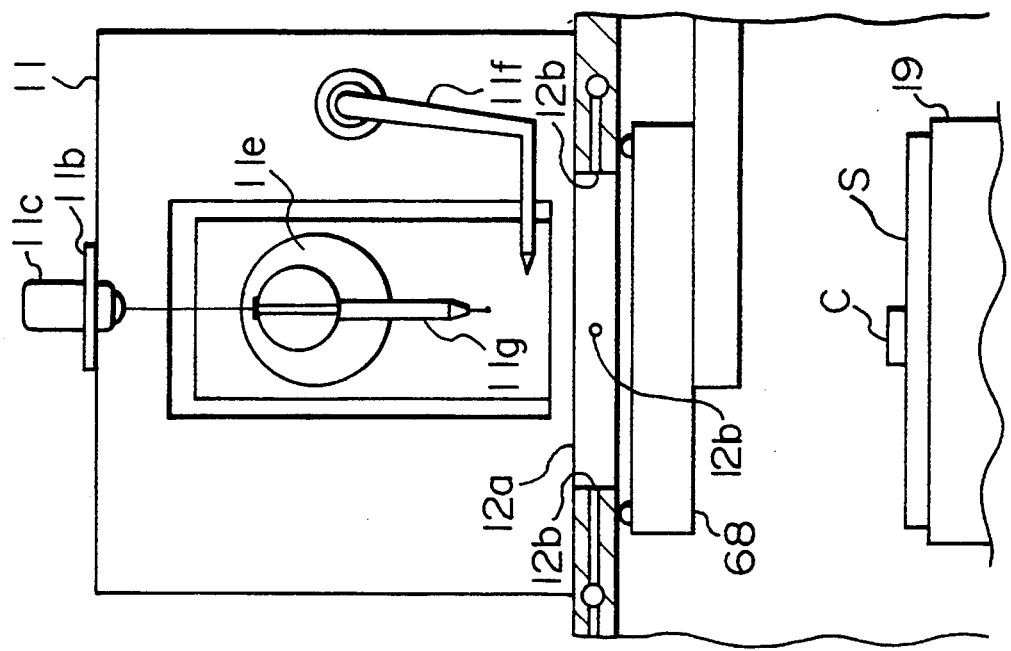
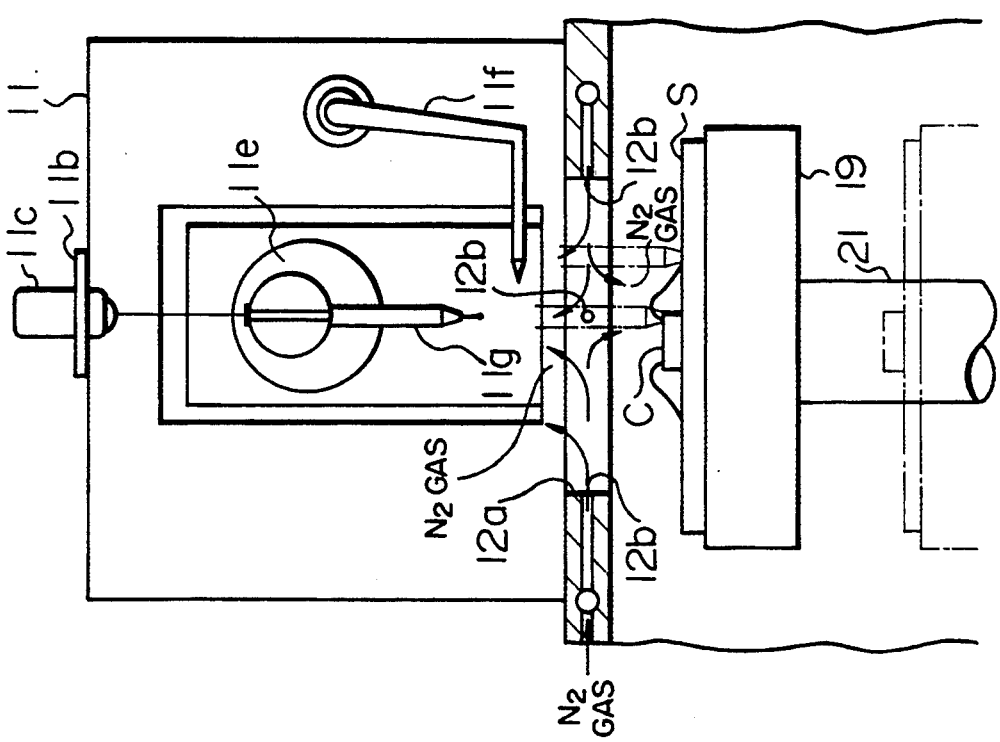

WIRE BONDING APPARATUS AND METHOD

FIELD OF THE INVENTION

The present invention relates to an apparatus and a method for wire-bonding electronic parts and, more particularly, to a wire bonding apparatus and a method for connecting an electrode of an electronic part (hereinafter, referred to as "a chip") to an electrode of a substrate by using a metal wire.

DESCRIPTION OF THE RELATED ART

In general, "wire bonding" means a process wherein electrodes of a chip, which has been cut out from a wafer and mounted on a substrate, such as a lead frame or a printed board, are connected to electrodes of the substrate with a metal wire by using a wire bonding apparatus.

The wire bonding process is performed by the following steps: putting a wire through a capillary tool retained at a tip portion of a horn; applying a voltage to a torch positioned adjacent to a lower end portion of the wire so as to achieve an electric spark between the torch and the end portion of the wire, thereby forming a molten metal bulb at the end portion of the wire; lowering the capillary tool so as to press the bulb onto an electrode of the chip, thus bonding the wire to the electrode thereof; raising the capillary tool from the chip electrode; shifting the capillary tool to above the corresponding electrode of the substrate; and then lowering the capillary tool so as to bond the wire to the corresponding electrode of the substrate in a similar manner.

The electrodes of chips are made of a metal such as aluminum or gold. Metals other than gold tend to oxidize in the atmosphere, thus forming an oxide film on the surface thereof. In addition, the surfaces of the electrodes of a chip are usually contaminated by deposition of organic substances originated from the surrounding air. Such an oxide film or a contaminant (organic substance) deteriorates the bonding performance of a molten metal bulb, thereby reducing the electrical conductivity of the bonding portion of an electrode.

To avoid such a problem, the wire bonding is generally performed by vibrating the capillary tool at a high frequency and strongly pressing a molten metal bulb onto an electrode. The capillary tool vibrating at a high frequency scrapes an oxide film or the like off the metal surface of the electrode while bonding.

However, the high-frequency vibration of a capillary tool often fails to thoroughly remove the oxide film or the organic substances from an electrode of a chip. If the bulb is extremely strongly pressed onto an electrode of the chip while vibrating the capillary tool at a high frequency in order to thoroughly remove the oxide film and the like, the impact caused thereby tends to crack the chip. If the chip is cracked, moisture in the atmosphere enters the chip through the crack, thus ruining the insulation of the circuit pattern provided on the chip surface. Further, if a molten metal bulb is pressed very strongly, it is deformed to a flat shape having an increased diameter. Therefore, it is required to increase a pitch of electrodes so that the bulbs will be spaced apart from each other, thereby preventing a chip from being downsized and highly integrated.

The electrodes of a substrate are also likely to have oxide films or organic contaminants on the surfaces thereof. The oxide films and the organic contaminants substantially reduce the bonding performance and conductivity.

It is hard to remove the organic contaminants from the electrode surface of the substrate even by supersonic vibration of the capillary tool.

A cleaning apparatus for removing such organic substances by using a plasma is disclosed in Japanese Patent Unexamined Publication No. 3-159143. However, even though such a plasma cleaning apparatus is employed, a substrate cleaned thereby must be transported into a separate wire bonding apparatus, and a substrate once cleaned will again have an oxide film or the like on the electrodes thereof when exposed to atmosphere.

SUMMARY OF THE INVENTION

An object of the present invention is to provide a wire bonding apparatus and a wire bonding method which rapidly and unfailingly performs wire bonding without damaging the electrodes of a chip and a substrate.

According to one aspect of the present invention, there is provided a wire bonding apparatus for connecting an electrode formed on a substrate to an electrode of a semiconductor chip mounted on a top of the substrate through an electrically conductive wire, the wire bonding apparatus comprising: a sealed casing having an opening through which the substrate is inserted into the casing, the opening being adapted to be closed; means for gas-tightly dividing the casing into a first chamber and a second chamber, the sealing means being movable for communicating the two chambers with each other; means for supplying an inert gas into the first chamber; means for removing an organic substance from a metal surface of the substrate and a metal surface of the semiconductor in the second chamber; means for connecting the electrode of the substrate to the electrode of the semiconductor chip through the wire in the first chamber; and means for transporting the substrate between the first chamber and the second chamber. According to another aspect of the present invention, there is provided a wire bonding method for connecting an electrode formed on a substrate to an electrode of a semiconductor chip mounted on a top of the substrate through an electrically conductive wire, the wire bonding method comprising the steps of: transporting the substrate mounting thereof the chip into a second chamber; sealing a first chamber and said second chamber gas-tightly; removing an oxide from metal surfaces of the substrate and the semiconductor chip in the second chamber; communicating the first chamber with the second chamber; transporting the substrate from the second chamber into the first chamber; separating the first chamber gas-tightly from the second chamber; supplying an inert gas into the first chamber; and connecting the electrode of the substrate to the electrode of the semiconductor chip through the wire.

BRIEF DESCRIPTION OF THE DRAWINGS

FIGS. 4 and 5 illustrate the wire bonding procedure of the apparatus shown in FIG. 1;

DETAILED DESCRIPTION OF THE PREFERRED EMBODIMENTS

The preferred embodiments of the present invention will be described in detail hereinafter with reference to the accompanying drawings.

Figure 1:
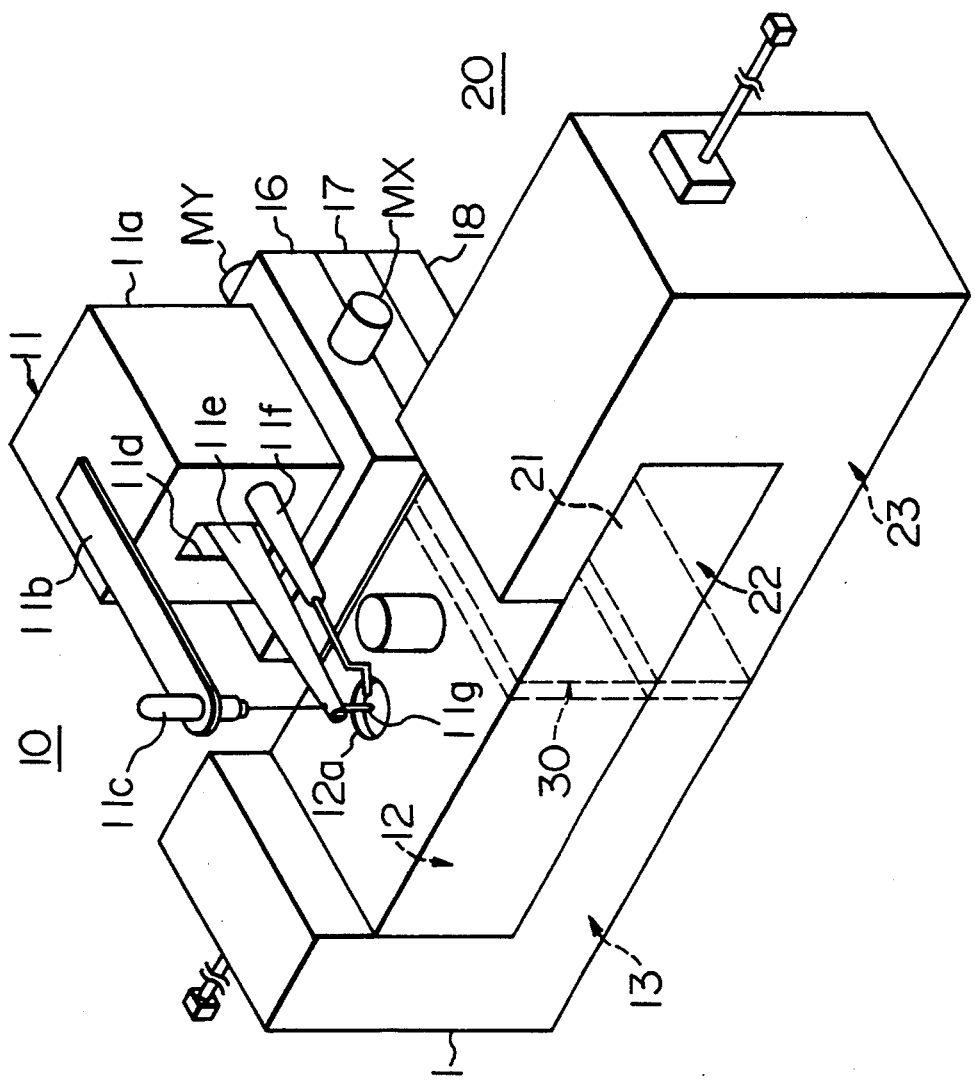
FIG. 1 is a perspective view of a wire bonding apparatus according to one embodiment of the present invention.
Figure 2:
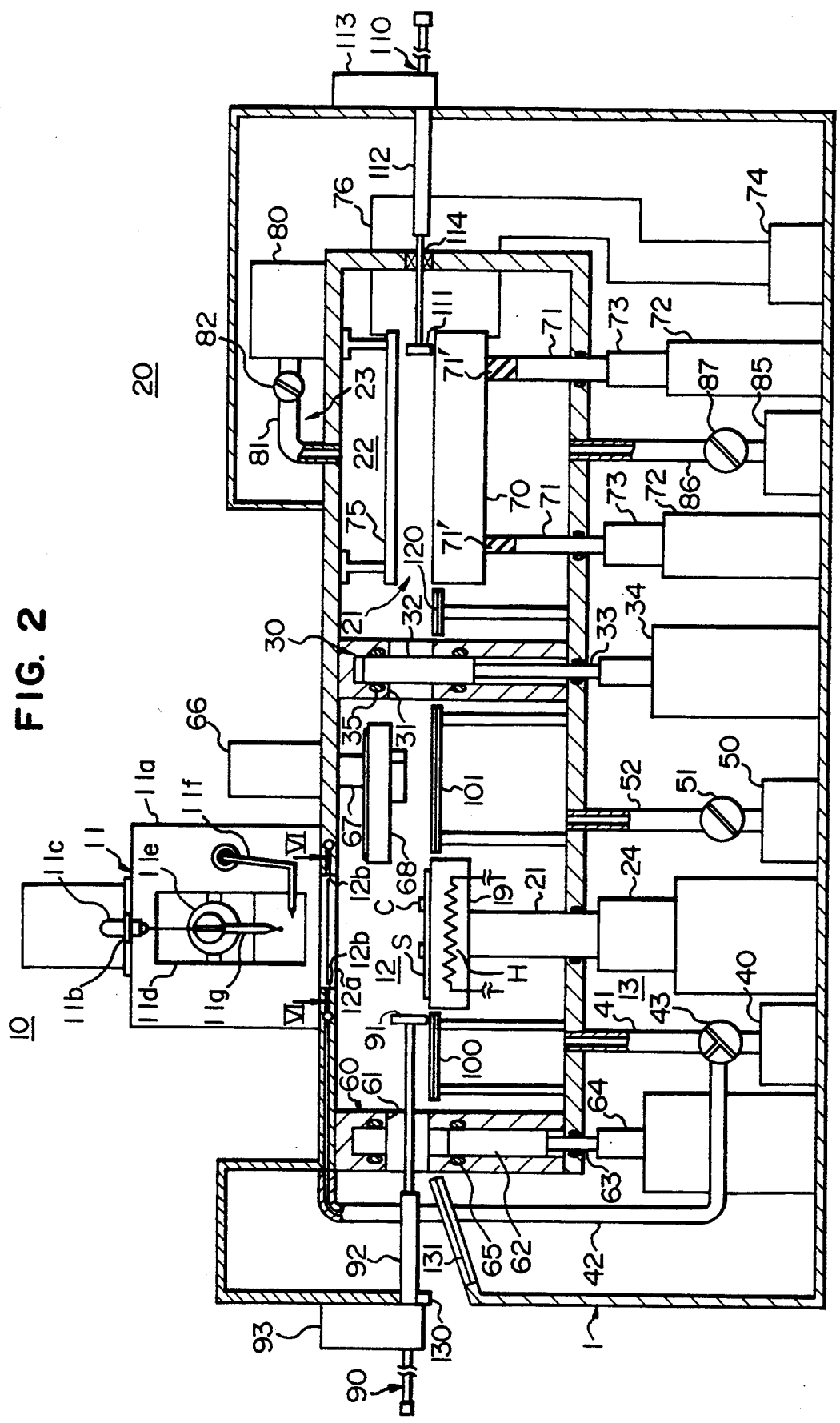
FIG. 2 is a sectional view of the apparatus shown in FIG. 1.

Referring to FIGS. 1 and 2, a wire bonding apparatus comprises a wire bonder section 10 and a plasma cleaning section 20. The wire bonder section 10 includes a wire bonder unit 11, a bonding chamber 12 and a nitrogen gas supplying unit 13. The plasma cleaning section 20 includes a plasma generating unit 21, a cleaning chamber 22 and a discharging gas supplying unit 23.

One rectangular parallelepiped chamber is divided by a wall 30 provided substantially in a middle of the chamber into the bonding chamber 12 and the cleaning chamber 22. A main casing 1 houses therein the rectangular parallelepiped chamber, the nitrogen gas supplying unit 13 and the discharging gas supplying unit 23.

The wire bonder unit 11 is mounted to a side of the bonding chamber 12. The plasma generating unit 21 is disposed inside the cleaning chamber 22.

The wire bonder unit 11 has a substantially rectangular parallelepiped casing 11a, and a supporting arm 11b extending horizontally from a top of the casing 11a above the bonding chamber 12. The supporting arm 11b supports at a front end portion thereof a wire suspender 11c for housing and suspending (and supplying) a wire made of gold.

Further, a horn 11e movable up and down projects from an opening 11d provided in a front of the casing 11a. The horn 11e extends to a position above a circular opening 12a provided in the top wall of the bonding chamber 12. A torch member 11f for achieving electric discharge for wire bonding is projected from a portion of the front of the casing 11a adjacent to the opening 11d. The torch member 11f extends substantially parallel to the horn 11e and a front end of the torch member 11f is arranged to be close to a capillary tool 11g connected to a front end portion of the horn 11e.

The capillary tool 11g has a vertical penetrating hole, through which the gold wire passes from the wire suspender 11c. Although not shown, vibrator means, such as a piezoelectric element, for vibrating the horn 11e at a high frequency is provided inside a base portion of the horn 11e, and driving means is provided for vertically pivoting the horn 11e.

As shown in FIG. 1, the wire bonder unit 11 is mounted on an X-table 16 which is moved by a motor MX along a horizontal axis (X-axis). The X-table 16 is mounted on a Y-table 17 which is moved by a motor MY along another horizontal axis (Y-axis) perpendicular to the X-axis. The Y-table 17 is mounted on a Z-table 18 which is vertically moved (along the Z-axis) by a motor MZ (not shown).

When the motors MX and MY are operated, the horn 11e, together with capillary tool 11g, is moved along the X- and Y-axis perpendicularly intersecting on a horizontal plane, that is, it is movable on the horizontal plane. By the operation of the motor MZ, the horn 11e and the capillary tool 11g are moved up and down. The nitrogen gas supplying unit 13 is provided under the bonding chamber 12. The nitrogen gas supplying unit 13 comprises a nitrogen gas storage 40 for storing nitrogen gas, which is an inert gas, a connecting pipe 41 connecting the nitrogen gas storage 40 and the bonding chamber 12, valve means 43 provided in the connecting pipe 41, and another connecting pipe 42 connecting the valve means 43 with outlets 12b (see FIG. 6) provided in an inner peripheral surface surrounding the opening 12a provided in the top wall of the bonding chamber 12. The nitrogen gas stored in the storage 40 is allowed to flow into the connecting pipes 41, 42 when the valve means 43 is opened.

The nitrogen gas supplying unit 13 further comprises an evacuator 50 for vacuum-evacuating the bonding chamber 12 by using a vacuum pump (not shown). The evacuator 50 has a connecting pipe 52 connected to the bonding chamber 12 via valve means 51.

As shown in FIG. 2, a placement table 19 for placing a substrate S is provided inside the bonding chamber 12, below the opening 12a. The placement table 19 has a heater H embedded therein. During the wire bonding operation, the heater H is controlled by a controller (not shown) so as to heat the substrate S and chips C up to an optimal temperature. The placement table 19 is horizontally supported by a rod 21 of a cylinder 24, and raised and lowered along with the vertical motions of the rod 21 achieved by a pneumatic mechanism (not shown) provided in the cylinder 24.

The wall 30 has a vertically elongated opening 31 through which a substrate S carrying chips C is transported. The wall 30 further has a shutter member 32 movable in a vertically elongated space formed in the wall 30. The shutter member 32 is connected at its lower end to a rod 33 which is retractable into a cylinder 34. The shutter member 32 is raised and lowered by a pneumatic mechanism (not shown) provided inside the cylinder 34 so as to shut and open the opening 31, respectively. To enhance the air-tightness of the bonding chamber 12, mechanical seals 35 made of an elastic material are provided in sliding portions between the shutter member 32 and the wall 30.

Similarly, a side wall 60 of the bonding chamber 12 has an opening 61 through which a substrate S carrying chips C is transported into and out of the bonding chamber 12. The wall 60 also has a shutter member 62 movable in a vertically elongated space formed therein. The shutter member 62 is connected at the lower end thereof to a rod 63 which is retractable into a cylinder 64. The shutter member 62 is raised and lowered by a pneumatic mechanism (not shown) provided inside the cylinder 64 so as to shut and open the opening 61. Mechanical seals 65 made of an elastic material are provided in sliding portions between the shutter member 62 and the wall 60.

The bonding chamber 12 further includes a sealing member 68 for sealing the opening 12a provided in the top wall thereof. The sealing member 68 is supported by a rod 67 which is connected to a driving mechanism 66 provided on the bonding chamber 12. The driving mechanism 66 has driving means and a coupling mechanism (not shown) provided therein and, thereby, raises and lowers the sealing member 68 and horizontally rotates it about the axis of the rod 67.

Next described will be the plasma cleaning section 20 of this embodiment with reference to FIG. 2. The plasma cleaning section 20 is based on the same principle as that of a plasma cleaning apparatus disclosed by the present applicant in Japanese Patent Unexamined Publication No. 3-159143.

The cleaning chamber 22 contains a placement table 70 for placing thereon a substrate S, the placement table 70 serving also as an electrode. The placement table 70 is horizontally retained through insulators 71' by two shafts 71 which are respectively supported by rods 73 of cylinders 72. The placement table 70 is raised and lowered along with the vertical movements of the rods 73 due to a pneumatic mechanism (not shown) provided in the cylinders 72.

The placement table 70 is connected to a power source 74 which applies a high voltage thereto. A conductive plate 75 is disposed above the placement table 70. The conductive plate 75 is connected through a ground lead 76 to a grounding portion of the power source 74, thus achieving a ground connection.

A discharging gas supplier 80 is disposed on top of the cleaning chamber 22. The discharging gas supplier 80 stores a discharge gas, that is, argon gas. The discharge gas supplier 80 is communicated with the cleaning chamber 22 by a connecting pipe 81 having valve means 82 provided at part way thereof.

An evacuator 85 is provided under the cleaning chamber 22. The evacuator 85 and the cleaning chamber 22 are communicated with each other through a connecting pipe 86 having valve means 87 provided at part way thereof. In the evacuator 85, a vacuum pump (not shown) draws gas out of the cleaning chamber 22. Although this embodiment uses argon gas, another gas having comparable properties may be used.

Next described will be the construction of a transporter section for transporting a substrate S with reference to FIG. 2. A rod 90 is horizontally movably provided in the main casing 1. The rod 90 has a hook portion 91 for transporting the substrate S in a longitudinal direction of the bonding chamber 12. The cylinder 92 and the driving mechanism 93 house therein a central portion of the rod 90. The central portion of the rod 90 is engaged at an outer periphery thereof with an actuator (not shown) provided inside the driving mechanism 93. The rod 90 is moved horizontally and rotated about its axis by means of a motor (not shown) provided in the driving mechanism 93.

Transportation tables 100 and 101 are provided between the opening 61 of the wall 60 and the placement table 19 and between the placement table 19 and the opening 31 provided in the wall 30, respectively. The top surfaces of the transportation tables 100, 101 are substantially at the same level as bottom portions of the openings 61, 31.

Similarly, a rod 110 is also horizontally movably provided in the main casing 1. The rod 110 has a hook portion 111 for transporting the substrate S in a longitudinal direction of the cleaning chamber 22 when the rod 110 is driven horizontally. The cylinder 112 and the driving mechanism 113 house therein a central portion of the rod 110. The central portion of the rod 110 is engaged at an outer periphery thereof with an actuator (not shown) provided inside the driving mechanism 113. The rod 110 is moved horizontally and rotated about its axis by means of a motor (not shown) provided in the driving mechanism 113. A transportation table 120 is provided between the wall 30 and the placement table 70. A top of the transportation table 120 is substantially at the same level as bottom portions of the these openings 31, 61.

The main casing 1 has an insertion opening 130. The insertion opening 130 allows a substrate S to be transported from the outside into the bonding chamber 12 through the opening 61. A plate-like tray portion 131 is provided at a bottom of the insertion opening 130 and extends adjacent to the bottom portion of the opening 61.

The operation of the thus-constructed wire bonding apparatus according to the present invention will be described with reference to FIGS. 3A to 3H.

Figure 3A:
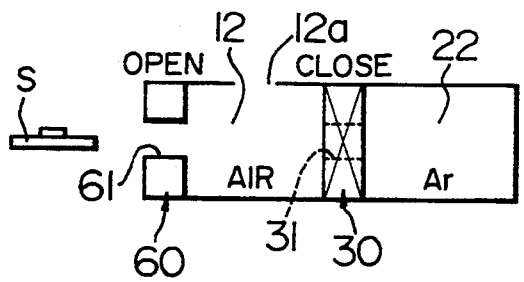
FIGS. 3A to 3H illustrate the operation of the apparatus shown in FIG. 1.

First, as shown in FIG. 3A, the opening 31 is closed, and the cleaning chamber 22 is filled with argon (Ar) gas at a partial vacuum condition. The "partial vacuum" means a gaseous pressure lower than the atmospheric pressure.

After the sealing means 68 has been moved by the driving mechanism 66 so as to close the opening 12a and a shutter member 62 has been lowered to open the opening 61, a substrate S is transported through the insertion opening 130 and the opening 61 to the transportation table 100. Then, the rod 90 is driven by the driving mechanism 93 so as to transport the substrate S from the transportation table 100 onto the placement table 19, and the shutter member 62 is raised to close the opening 61.

Figure 3E:
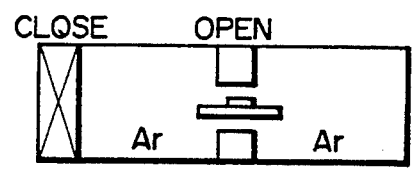
Figure 3B:
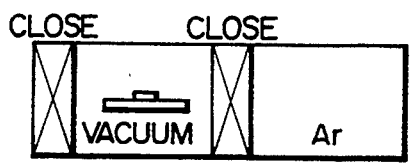

Next, as shown in FIG. 3B, the bonding chamber 12 is vacuum-evacuated into a partial vacuum condition by means of the evacuator 50.

Figure 3F:
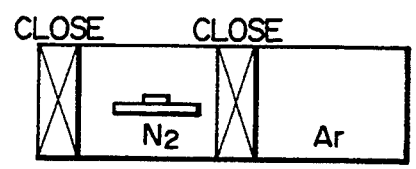
Figure 3C:
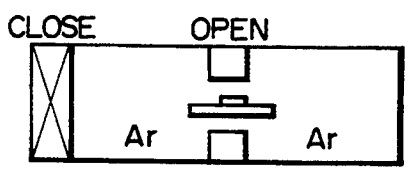

Then, as shown in FIG. 3C, after the shutter member 32 is lowered by operating the cylinder 34 so as to open the opening 31, the rod 110 transports the substrate from the bonding chamber 12 through the opening 31 to the placement table 70 in the cleaning chamber 22.

Figure 3G:
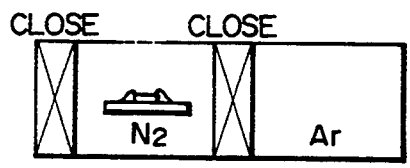
Figure 3D:
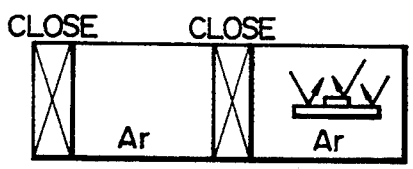
Figure 3H:
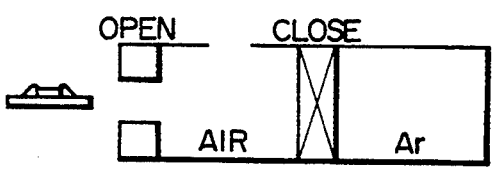

After the shutter 32 is raised by operating the cylinder 34 to close the opening 31, the vacuum pump 85 is operated to draw out the argon gas from the cleaning chamber 22 while the discharging gas supplier 80 supplies argon gas to the cleaning chamber 22, as shown in FIG. 3D. During this procedure, the cleaning chamber 22 is maintained in a partial vacuum condition. Then, the power source 74 is operated so as to apply a high voltage to the placement table 70.

This high-voltage application achieves plasma discharge between the placement table 70 and the conductive plate 75. The argon ions and electrons produced thereby are accelerated to hit the surfaces of the substrate and the chips mounted thereon, thereby removing (driving out) oxide films or organic substances from the electrodes thereof.

After the electrodes of the substrate and the chips are plasma-cleaned, the valve means 87 and 82 are closed to stop supplying argon gas into the cleaning chamber 22 and to stop drawing out the argon gas from the cleaning chamber 22. Then, after the opening 31 is opened, the rod 110 transports the cleaned substrate from the placement table 70 in the cleaning chamber 22 to the placement table 19 in the bonding chamber 12 through the opening 31 (FIG. 3E).

FIG. 4 shows the substrate S carrying chip C which has been plasma-cleaned and transported onto the placement table 19.

Then, after the opening 31 is closed by the shutter member 32, the valve means 43 is released to supply nitrogen ($N_2$) gas from the nitrogen gas storage 40 to the bonding chamber 12 and the opening 12a (FIG. 3F). By supplying nitrogen gas, the pressure inside the bonding chamber 12 is increased from the partial vacuum to the atmospheric pressure.

Then, the driving mechanism 66 is operated to lower and turn the sealing means 68 so as to open the opening 12a, and the rod 21 of the cylinder 20 is projected upward to raise the substrate S up to a position adjacent to the opening 12a, as shown in FIG. 5.

Figure 6:
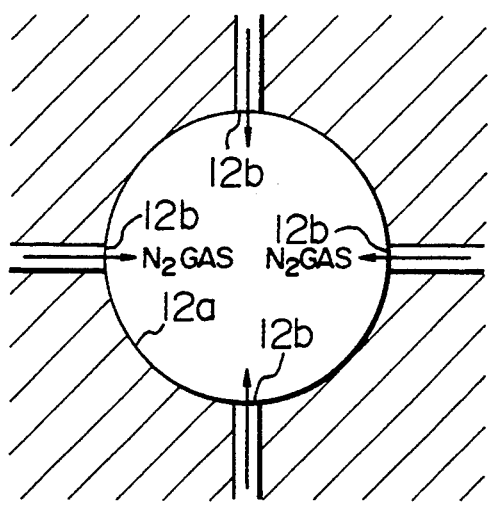
FIG. 6 is a fragmentary sectional view taken along the line VI—VI of FIG. 2.

As shown in FIG. 6, the nitrogen gas is jetted out from the outlets 12b provided on the peripheral surface of the opening 12a toward the center thereof, thus preventing a substantially large amount of nitrogen gas from flowing out of the bonding chamber 12 through the opening 12a. While nitrogen gas is jetted out from the outlets 12b, the wire bonder unit 11 is operated to connect the electrodes of the chips C and the electrodes of the substrate S by means of the gold wire (FIG. 3G). Wire bonding is performed by vertically pivoting the capillary tool 11g through the opening 12a while the capillary tool 11g is horizontally shifted from one electrode to another by means of the X and Y-tables 16, 17.

Nitrogen gas is continuously supplied to the opening 12a during the wire bonding process, thereby protecting the electrodes of the chips and substrate from oxidation, that is, maintaining the activated surfaces thereof.

Because the electrodes of the chips and substrate have been made free from oxide films by the plasma-cleaning process preceding the wire bonding process, only a small amount of energy is required to achieve excellent wire bonding without a failure. Further, a conventional wire bonding apparatus tends to allow oxygen in the atmosphere to reach and oxidize the surfaces of the electrodes and the wire, thus impeding the wire bonding process. On the other hand, the wire bonding apparatus of this embodiment prevents oxygen in the atmosphere from entering the apparatus by jetting nitrogen gas to the opening 12a, thus helping to achieve excellent wire bonding.

Figure 8:
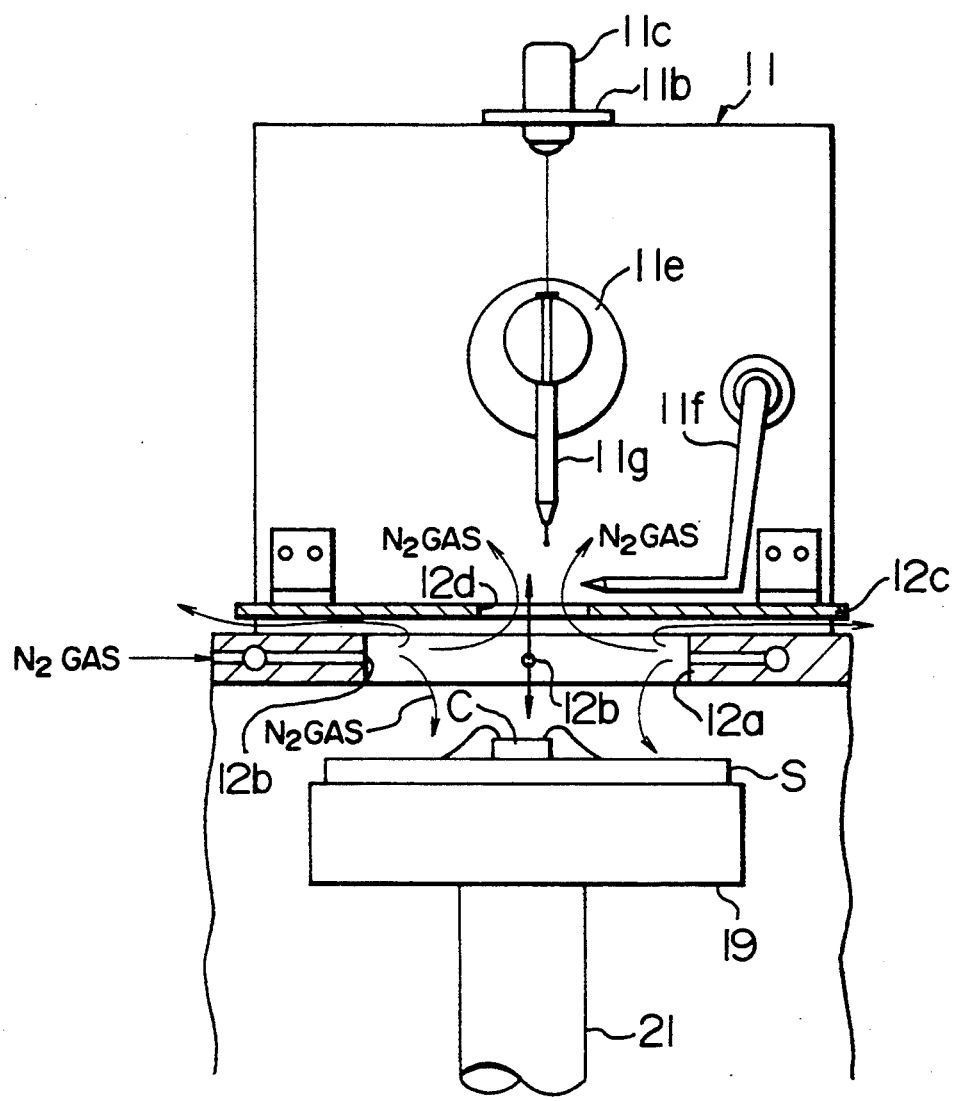
FIG. 8 is a partial sectional view of a wire-bonder section of a wire bonding apparatus according to still another embodiment of the present invention.

Further, as shown in FIG. 8, when a shield plate 12c is provided a little above the opening 12a, the wire bonding can be achieved more effectively. The shield plate 12c has an opening 12d which is smaller than the opening 12a, but large enough to allow the capillary tool 11g to pass through it for wire bonding. The nitrogen gas from the outlets 12b forcefully flows out through a gap between the shield plate 12c and the main casing 1 and through the opening 12d.

According to this, the oxygen in the atmosphere is prevented from entering the bonding chamber 12, thereby maintaining an interior of the boding chamber in a nitrogen gas atmosphere in a better condition. When the wire bonding process is completed, the nitrogen gas supply from the nitrogen gas storage 40 is stopped, and the placement table 19 is lowered. After that, the substrate S is transported out of the bonding chamber 12 by means of the rod 90.

As described above, this embodiment is able to sequentially perform the plasma cleaning process and the wire bonding process without exposing the substrate to the atmosphere during these processes.

Figure 7:
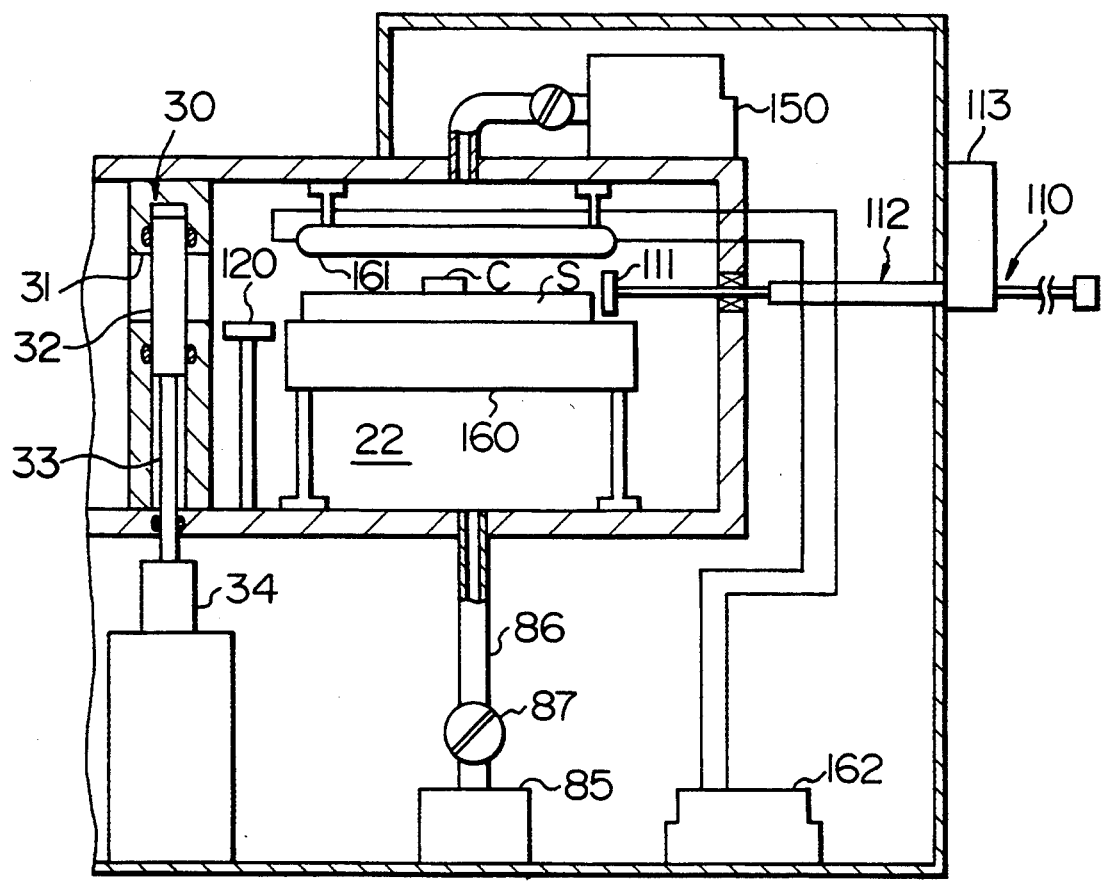
FIG. 7 is a partial sectional view of a cleaning section of a wire bonding apparatus according to another embodiment of the present invention.

FIG. 7 is a sectional view of the cleaning section of another embodiment of the wire bonding apparatus of the present invention. In this embodiment, a gas supplier 150 supplies oxygen or ozone into a cleaning chamber 22, instead of the argon gas. An ultraviolet (UV) lamp 161 is provided over a placement table 160 for carrying a substrate S. The UV lamp 161 is connected to a power source 162. When switched on, the UV lamp emits UV light over the substrate S on the placement table 160. Other means, components and portions shown in FIG. 7 are substantially the same as those described above, and will not be described again.

When the cleaning chamber 22 is supplied with oxygen gas from the gas supplier 150 and the UV lamp 161 is switched on, oxygen molecules are changed by the UV light into oxygen radicals having a higher energy level. When hitting the surfaces of the substrate S, the oxygen radicals oxidize the organic substances deposited thereon into carbon dioxide gas. The oxygen radicals abut against surfaces of the electrodes to remove the oxide film therefrom. The carbon dioxide gas is drawn out of the chamber 22 by a suction pump 170.

If, alternatively, ozone is supplied from the gas supplier 150 into the cleaning chamber 22, the oxygen radicals are also produced by UV irradiation, by which the surfaces of the substrate are cleaned.

The invention is not limited to the above embodiments but may cover various modifications. For example, a timing belt may be used as means for transporting a substrate. By using such means, a substrate is transported from the bonding chamber 12 into the cleaning chamber 22 for the cleaning process, and transferred back to the bonding chamber 12 for the wire bonding process, and then transported out of the casing.

What is claimed is:

1. A wire bonding apparatus for bonding an electrode formed on a substrate to an electrode of a semiconductor chip mounted on a top of said substrate through an electrically conductive wire, said wire bonding apparatus comprising:
    a sealed casing having a first opening through which said substrate is inserted into said casing, said opening being adapted to be opened and closed;
    divider means for gas-tightly dividing said casing into a first chamber and a second chamber, said divider means including sealing means which is movable for communicating said two chambers with each other, said first chamber including a second opening to the outside;
    means for supplying an inert gas into said first chamber;
    means for removing contaminants or oxide from a metal surface of said substrate and a metal surface of said semiconductor in said second chamber;
    means for wire bonding said electrode formed on said substrate to said electrode of said semiconductor chip, when said substrate and said semiconductor chip are located in said first chamber, via said second opening of said first chamber from the outside of said first chamber; and
    means for transporting said substrate between said first chamber and said second chamber.

2. A wire bonding apparatus as in claim 1, wherein said means for wire bonding bonds said electrodes when said first chamber has said inert gas therein.

3. A wire bonding apparatus according to claim 1, further comprising first suction means for drawing gas from said first chamber and second suction means for drawing gas from said second chamber.

4. A wire bonding apparatus according to claim 1, wherein said removing means includes means for supplying a discharging gas into said second chamber and means for generating glow discharge in said second chamber.

5. A wire bonding apparatus according to claim 4, wherein said discharging gas is argon.

6. A wire bonding apparatus for connecting an electrode formed on a substrate to an electrode of a semiconductor chip mounted on a top of said substrate through an electrically conductive wire, said wire bonding apparatus comprising:
- a sealed casing having an opening through which said substrate is inserted into said casing, said opening being adapted to be opened and closed;
- divider means for gas-tightly dividing said casing into a first chamber and a second chamber, said divider means including sealing means which is movable for communicating said two chambers with each other;
- means for supplying an inert gas into said first chamber;
- means for removing contaminants or oxide from a metal surface of said substrate and a metal surface of said semiconductor in said second chamber;
- means for connecting said electrode formed on said substrate to said electrode of said semiconductor chip, when said substrate and said semiconductor chip are located in said first chamber, via said wire in said first chamber; and
- means for transporting said substrate between said first chamber and said second chamber, wherein said removing means includes means for supplying oxygen gas or ozone gas into said second chamber, and means for radiating ultraviolet light inside said second chamber.

7. A wire bonding method for bonding an electrode formed on a substrate to an electrode of a semiconductor chip mounted on a top of said substrate through an electrically conductive wire, said wire bonding method comprising the steps of:
- transporting said substrate with said chip mounted thereon into a second chamber;
- sealing a first chamber and said second chamber gas-tightly;
- removing contaminants or oxide from metal surfaces of said substrate and said semiconductor chip in said second chamber;
- communicating said first chamber with said second chamber;
- transporting said substrate with said chip mounted thereon from said second chamber into said first chamber;
- separating said first chamber gas-tightly from said second chamber;
- supplying an inert gas into said first chamber; and
- introducing a wire bonding tool into said first chamber through an opening provided in said first chamber while said inert gas is in said first chamber and wire-bonding said electrode formed on said substrate to said electrode of said semiconductor chip.

8. A wire bonding apparatus for bonding an electrode formed on a substrate to an electrode of a semiconductor chip mounted on a top of said substrate through an electrically conductive wire, said wire bonding apparatus comprising:
- a sealed casing having a first opening through which said substrate with said chip mounted thereon is inserted into said casing, said first opening being adapted to be opened and closed;
- divider means for gas-tightly dividing said casing into a first chamber and a second chamber, said divider means including sealing means which is movable for communicating said two chambers with each other, said first chamber including a second opening to the outside;
- means for supplying an inert gas into said first chamber;
- means for supplying oxygen gas or ozone gas into said second chamber;
- bonding means for wire-bonding said electrode formed on said substrate to said electrode of said semiconductor chip, when said substrate and said semiconductor chip are located in said first chamber, via said second opening in said first chamber;
- means for generating discharge in said second chamber; and
- means for transporting said substrate between said first chamber and said second chamber.

9. A wire bonding apparatus as in claim 8, wherein said means for wire bonding bonds said electrodes when said first chamber has said inert gas therein.

10. A wire bonding apparatus according to claim 8, further comprising first suction means for drawing gas from said first chamber and second suction means for drawing gas from said second chamber.

11. A wire bonding apparatus according to claim 10, wherein said bonding means is disposed outside said first chamber and wherein said bonding means has means for connecting said wire to said electrode formed on said substrate and to an electrode of said semiconductor chip, said bonding means being movable into said first chamber via said second opening so as to perform said wire bonding.

12. A wire bonding method for bonding an electrode formed on a substrate to an electrode of a semiconductor chip mounted on a top of said substrate through an electrically conductive wire, said wire bonding method comprising the steps of:
- transporting said substrate having said chip mounted thereon into a second chamber;
- sealing a first chamber and said second chamber gas-tightly;
- supplying oxygen gas or ozone gas into said second chamber and generating a glow discharge therein to remove contaminants or oxide from metal surfaces of said substrate and said semiconductor chip in said second chamber;
- communicating said first chamber with said second chamber;
- transporting said substrate from said second chamber into said first chamber;
- separating said first chamber gas-tightly from said second chamber;
- supplying an inert gas into said first chamber; and
- introducing a wire bonding tool into said first chamber through an opening provided in said first chamber while said inert gas is in said first chamber and wire-bonding said electrode formed on said substrate to said electrode of said semiconductor chip.

13. A wire bonding method comprising the steps of:
- transporting a substrate having a semiconductor chip mounted thereon into a second chamber to be sealed;
- removing contaminants or oxide from surfaces of said substrate and said semiconductor chip in the sealed second chamber;
- transporting said substrate from said second chamber into a first chamber without exposing said substrate and said semiconductor chip to an atmosphere; and
- introducing a wire bonding tool into said first chamber through an opening provided in said first chamber while said inert gas is in said first chamber and wire-bonding an electrode formed on said substrate to an electrode of said semiconductor chip mounted on a top of said substrate through an electrically conductive wire while said substrate and said semiconductor chip are located in said first chamber and while filling a space housing therein at least said electrode of said substrate and said semiconductor chip with an inert gas.

* * * * *